United States Patent
Zeng

(10) Patent No.: US 10,775,914 B2
(45) Date of Patent: Sep. 15, 2020

(54) TOUCH PANEL SWITCH, TOUCH PANEL AND MANUFACTURE METHOD OF TOUCH PANEL SWITCH

(71) Applicant: Wuhan China Star Optoelectronics Technology Co., Ltd., Wuhan, Hubei (CN)

(72) Inventor: Shuanghua Zeng, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 230 days.

(21) Appl. No.: 15/735,808

(22) PCT Filed: Oct. 19, 2017

(86) PCT No.: PCT/CN2017/106793
§ 371 (c)(1),
(2) Date: Dec. 12, 2017

(87) PCT Pub. No.: WO2019/056435
PCT Pub. Date: Mar. 28, 2019

(65) Prior Publication Data
US 2020/0033974 A1   Jan. 30, 2020

(30) Foreign Application Priority Data

Sep. 19, 2017   (CN) .......................... 2017 1 0847436

(51) Int. Cl.
*G06F 3/041* (2006.01)
*G02F 1/1333* (2006.01)
*H03K 17/96* (2006.01)
*H01L 27/32* (2006.01)
*H01L 27/12* (2006.01)

(52) U.S. Cl.
CPC ........ *G06F 3/0412* (2013.01); *G02F 1/13338* (2013.01); *H01L 27/1244* (2013.01); *H01L 27/323* (2013.01); *H01L 27/3244* (2013.01); *H03K 17/96* (2013.01)

(58) Field of Classification Search
CPC . G06F 3/0412; G02F 1/13338; H01K 27/323; H01K 27/3244; H03K 17/96
See application file for complete search history.

(56) References Cited

U.S. PATENT DOCUMENTS

| 9,201,533 | B2 * | 12/2015 | Kim | G06F 3/0412 |
| 9,372,359 | B2 * | 6/2016 | Nagami | G02F 1/13338 |
| 9,638,949 | B1 * | 5/2017 | Kim | G02F 1/13338 |
| 10,282,016 | B2 * | 5/2019 | Yoon | G06F 3/0412 |
| 10,388,676 | B2 * | 8/2019 | Saitoh | H01L 29/786 |
| 2016/0328058 | A1 * | 11/2016 | Peng | G06F 3/0412 |
| 2017/0205932 | A1 * | 7/2017 | Yang | G06F 3/0412 |

* cited by examiner

Primary Examiner — Sardis F Azongha
(74) Attorney, Agent, or Firm — Hemisphere Law, PLLC; Zhigang Ma

(57) ABSTRACT

A touch panel is provided. The display panel includes a glass substrate, a buffer layer, a gate insulating layer and a second metal layer. The display panel further comprises a flat organic layer, a first dielectric layer, a third metal layer, a second dielectric layer and a bottom ITO (indium tin oxide) layer. In this invention, which is not restrict design and could satisfy requirement of original process windows, decrease rework rate and enhance productivity.

13 Claims, 3 Drawing Sheets

TOUCH PANEL SWITCH, TOUCH PANEL AND MANUFACTURE METHOD OF TOUCH PANEL SWITCH

RELATED APPLICATIONS

The present application is a National Phase of International Application Number PCT/CN2017/106793, filed Oct. 19, 2017, and claims the priority of China Application No. 201710847436.8, filed Sep. 19, 2017.

FIELD OF THE DISCLOSURE

The disclosure relates to a semiconductor technical field, and more particularly to a touch panel switch, touch panel and a manufacture method of touch panel switch.

BACKGROUND

ITP (In Cell Touch Panel) integrates the touch function to the liquid crystal displays, and detecting the varying intensity of light from panel surface while touching which is achieve to touch sensing. It provides numerous advantages such as low cost, thin bodies and more convenient use.

Please refer to FIG. 1. The signals transported between metal 3 layer 7' and the metal 2 layer 4' in existing ITP product, which is according to four holes on insulating layer1 6' and insulating layer2 8' by etching on touch panel switch. Metal 3 layer 7' bridge over two holes etched on insulating Layer2 8', metal 2 layer 4' bridge over two holes simultaneously etched on both insulating layer1 6' and insulating Layer2 8'. The metal 3 layer 7' and the metal 2 layer 4' communicate to each other by bottom Indium Tin Oxide layer 9' which coated on inner surface of four holes and upper surface of insulating Layer2 8'. However, as shown in FIG. 2. When the back value is 0.6 um, the metal 3 layer 7' is bridge over to four holes so that bottom Indium Tin Oxide 9' cannot connect to metal 2 layer 4'. It will cause metal 3 layer 7' cannot communicate to metal 2 layer 4'. Therefore metal 3 layer 7' needs to increase back value to 0.9 um (shown as FIG. 1) for ensure the design within process capability, it will restrict both design and process windows.

SUMMARY

A technical problem to be solved by the disclosure is to provide a touch panel switch, a touch panel and manufacture method of touch panel switch with satisfy process windows, decrease rework rate, increase productivity and not restrict design.

An objective of the disclosure is achieved by following embodiments. In particular, a touch panel switch includes a glass substrate, a buffer layer, a gate insulating layer, a second metal layer, a flat organic layer, a first dielectric layer, a third metal layer, a second dielectric layer and a bottom ITO (indium tin oxide) layer.

The buffer layer is on the glass substrate.

The gate insulating layer is on the buffer layer.

The second metal layer is on the gate insulating layer.

The flat organic layer is coated on the second metal layer, and an upward open groove located on the flat organic layer by etching.

The first dielectric layer is coated on the flat organic layer, and an inner surface of the upward open groove and a bottom surface of the upward open groove.

The third metal layer is on the first dielectric layer, a side of the third metal layer is located outside the upward open groove and another side of the third metal layer is along the first dielectric layer and extends downwardly to the upward open groove.

The second dielectric layer is on the first dielectric layer and the third metal layer, and two first through-holes are arranged on the second dielectric layer by etching, the two first through-holes pass through the first dielectric layer and the second dielectric layer and are spaced away from the third metal layer.

Two second through-holes are arranged on the third metal layer and through the second dielectric layer by etching.

The bottom ITO (indium tin oxide) layer on the second dielectric layer, inner surface of the two first through-holes and bottom surface of the two first through-holes, and inner surface of the two second through-holes and bottom surface of the two second through-holes corresponded to the third metal layer.

In an embodiment, outside contour of the upward open groove is quadrilateral shape.

In an embodiment, outside contour of the third metal layer is Z-shaped structure.

In an embodiment, the two second through-holes are positioned on the upward open groove.

According to another aspect of the disclosure, the disclosure further provides a touch panel; the touch panel comprises a touch panel switch. The touch panel switch includes a glass substrate, a buffer layer, a gate insulating layer, a second metal layer, a flat organic layer, a first dielectric layer, a third metal layer, a second dielectric layer and a bottom ITO (indium tin oxide) layer.

The buffer layer is on the glass substrate.

The gate insulating layer is on the buffer layer.

The second metal layer is on the gate insulating layer.

The flat organic layer is coated on the second metal layer, and an upward open groove is located on the flat organic layer by etching.

The first dielectric layer is coated on the flat organic layer, and an inner surface of the upward open groove and a bottom surface of the upward open groove.

The third metal layer is on the first dielectric layer, a side of the third metal layer is located outside the upward open groove and another side of the third metal layer is along the first dielectric layer and extends downwardly to the upward open groove.

The second dielectric layer is on the first dielectric layer and the third metal layer, and two first through-holes are arranged on the second dielectric layer by etching, the two first through-holes pass through the first dielectric layer and the second dielectric layer are spaced away from the third metal layer.

Two second through-holes are arranged on the third metal layer and through the second dielectric layer by etching.

The bottom ITO (indium tin oxide) layer on the second dielectric layer, inner surface of the two first through-holes and bottom surface of the two first through-holes, and inner surface of the two second through-holes and bottom surface of the two second through-holes.

In an embodiment, outside contour of the upward open groove is quadrilateral shape.

In an embodiment, outside contour of the third metal layer is Z-shaped structure.

In an embodiment, the two second through-holes are positioned on the upward open groove.

According to another aspect of the disclosure, the disclosure further provides a manufacture method of touch panel switch, comprising following steps.

Arranging a glass substrate.

Arranging a buffer layer, a gate insulating layer and a second metal layer in sequentially on the glass substrate.

Coating a flat organic layer on the second metal layer, etching an upward open groove on the flat organic layer.

Coating a first dielectric layer on the flat organic layer, and an inner surface of the upward open groove and bottom surface of the upward open groove corresponding to the second metal layer.

Arranging a third metal layer on the first dielectric layer, a side of the third metal layer is located outside the upward open groove and another side of the third metal layer is along the first dielectric layer and extends downwardly to inside the upward open groove.

Coating a second dielectric layer on the first dielectric layer and the third metal layer, and two first through-holes are arranged on the second dielectric layer by etching, the two first through-holes pass through the first dielectric layer and the second dielectric layer and are spaced away from the third metal layer, and two second through-holes are arranged on the third metal layer and through the second dielectric layer by etching.

Covering a bottom ITO (indium tin oxide) layer on the second dielectric layer, inner surface of the two first through-holes and bottom surface of the two first through-holes, and inner surface of the two second through-holes and bottom surface of the two second through-holes.

In an embodiment, outside contour of the upward open groove is quadrilateral shape.

In an embodiment, outside contour of the third metal layer is Z-shaped structure.

In an embodiment, both of the two first through-holes have same depth, and both of the two second through-holes have same depth.

In an embodiment, the two second through-holes are positioned on the upward open groove.

Comparing to traditional touch panel, a touch panel of the invention has a flat organic layer and a third metal layer bending along outside contour of upward open groove on flat organic layer for ensure the third metal layer cannot bridge over four holes. It could keep original back value of the third metal layer (don't need to change length of the third metal layer) and for ensure transport signals between the third metal layer and the second metal layer, so that could satisfy requirement of original process windows, decrease rework rate and enhance productivity.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
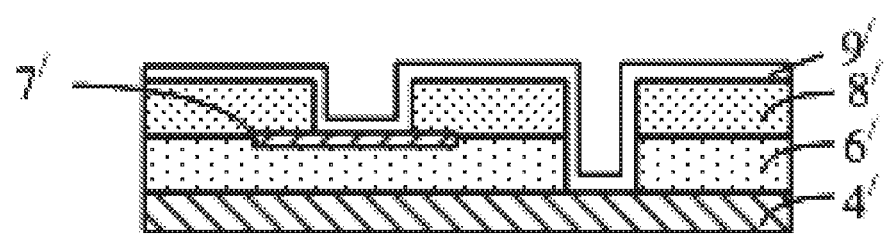
FIG. 1 is a partial section view of a third metal layer and a second metal layer communicate to each other in normal status of a touch panel switch according to prior art.
Figure 2:
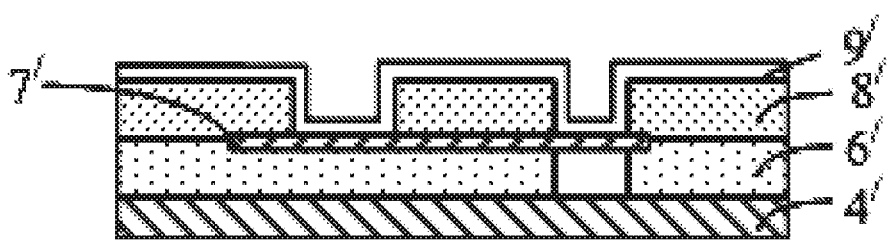
FIG. 2 is a partial section view of a third metal layer and a second metal layer communicate to each other in abnormal status of a touch panel switch according to prior art.
Figure 3:
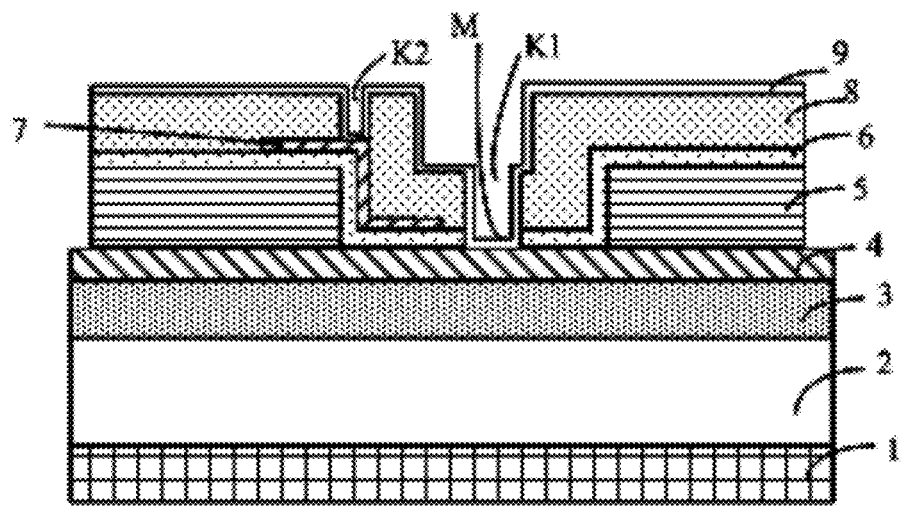
FIG. 3 is a partial section view of the touch panel switch according to an first embodiment of the disclosure.
Figure 4:
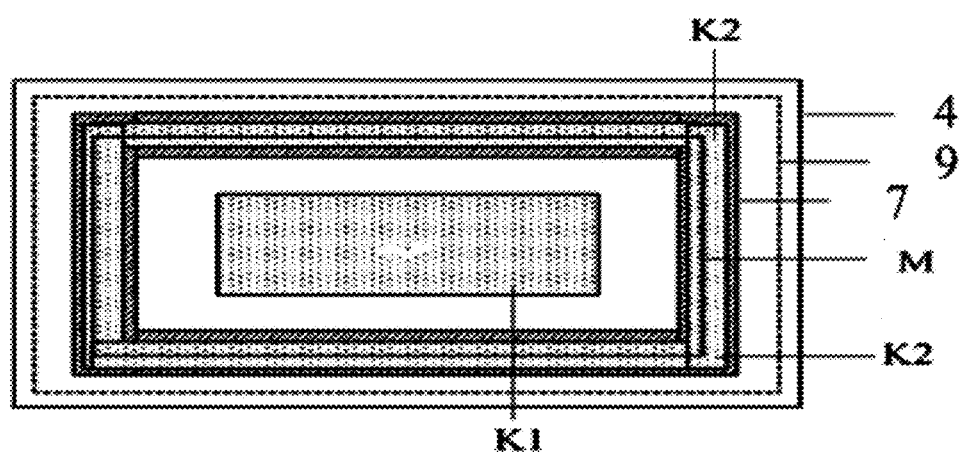
FIG. 4 is a partial top view of the touch panel switch according to the first embodiment of the disclosure.

In the following, touch panel switch associated with the first embodiment in the disclosure will be described with reference to FIG. 3 and FIG. 4.

The touch panel switch includes a glass substrate 1, a buffer layer 2, a gate insulating layer 3, a second metal layer 4, a flat organic layer 5, a first dielectric layer 6, a third metal layer 7, a second dielectric layer 8 and a bottom ITO (indium tin oxide) layer 9.

The buffer layer 2 is on the glass substrate 1.

The gate insulating layer 3 is on the buffer layer 2.

The second metal layer 4 is on the gate insulating layer 3.

The flat organic layer 5 is coated on the second metal layer 4, and an upward open groove M is located on the flat organic layer 5 by etching.

The first dielectric layer 6 is coated on the flat organic layer 5, and an inner surface of the upward open groove M and a bottom surface of the upward open groove M. The bottom surface is corresponding to the second metal layer 4.

The third metal layer 7 is on the first dielectric layer 6, a side of the third metal layer 7 is located outside the upward open groove M and another side of the third metal layer 7 is along a side top edge of the first dielectric layer 6 to correspondingly region of the upward open groove M and extends downwardly to inside the upward open groove M.

The second dielectric layer 8 is covered on the first dielectric layer 6 and the third metal layer 7, and two first through-holes K1 are corresponding to the upward open groove M and arranged on the second dielectric layer 8 by etching, the two first through-holes K1 pass through both of the first dielectric layer 6 and the second dielectric layer 8. Two first through-holes K1 are spaced away from the third metal layer 7. Specifically, two the first through-holes K1 through upper and bottom surfaces of the first dielectric layer 6, and upper and bottom surfaces of the second dielectric layer 8.

Two second through-holes K2 are arranged on the third metal layer 7 and through the second dielectric layer 8 by etching. Specifically, two the second through-holes K2 through upper and bottom surfaces of the second dielectric layer 8.

The bottom ITO (indium tin oxide) layer 9 is covered on the second dielectric layer 8, inner surface of the two first through-holes K1 and bottom surface of the two first through-holes K1 which is corresponded to the second metal layer 4, and inner surface of the two second through-holes K2 and bottom surface of the two second through-holes K2 which is corresponded to the third metal layer 7.

It could be understood that, according to add other structure of flat organic layer 5 on upward open groove M for bending length of the third metal layer 7. It could keep original back value of the third metal layer 7 (don't need to change length of the third metal layer, ex: 0.6 um) for satisfy requirement of original process windows, and also could transport signals between the third metal layer 7 and the second metal layer 4.

Further, the outside contour of the upward open groove M could be designed to quadrilateral shape, polygon shape, circular shape, and so on.

Further, the outside contour of the third metal layer 7 is Z-shaped structure or reverse L-shaped structure (⌐-shaped).

Further, both of two second through-holes K2 are located on the upward open groove M. It could satisfy requirement of original process windows.

According to another aspect of the disclosure, the disclosure further provides a touch panel of the second embodiment. The touch panel comprises a touch panel switch of the first embodiment in this disclosure. The touch panel switch of the second embodiment has similar structure and connection to the touch panel switch of the first embodiment, and will not be further explained herein.

Figure 5:
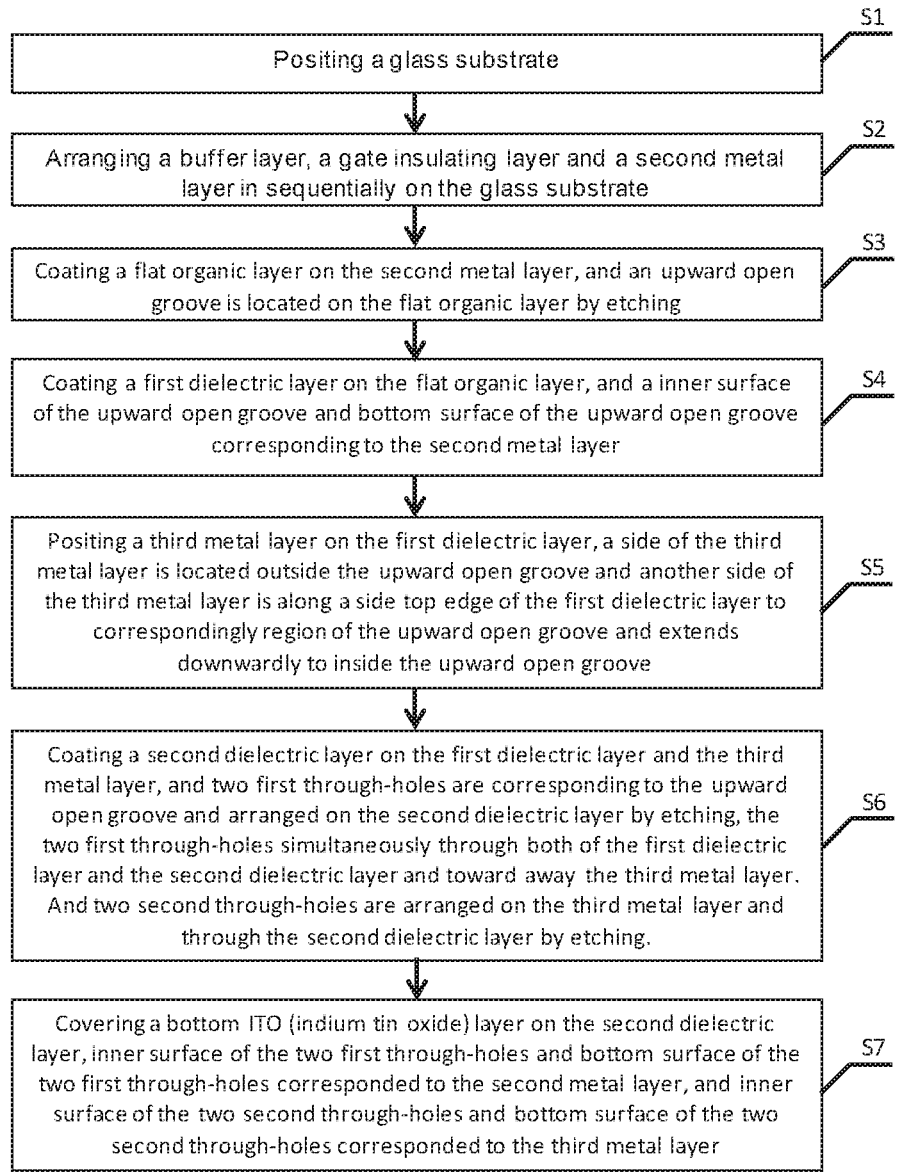
FIG. 5 is a flow chart for manufacture method of the touch panel switch according to the third embodiment of the disclosure.

Please refer to FIG. 5. The disclosure further provides a manufacture method of touch panel switch of the third embodiment, comprising following steps.

S1, positing a glass substrate.

S2, arranging a buffer layer, a gate insulating layer and a second metal layer in sequentially on the glass substrate from top to bottom.

S3, coating a flat organic layer on the second metal layer, and an upward open groove is located on the flat organic layer by etching.

S4, coating a first dielectric layer on the flat organic layer, and a inner surface of the upward open groove and bottom surface of the upward open groove. The bottom surface is corresponding to the second metal layer.

S5, positing a third metal layer on the first dielectric layer, a side of the third metal layer is located outside the upward open groove and another side of the third metal layer is along a side top edge of the first dielectric layer to correspondingly region of the upward open groove and extends downwardly to inside the upward open groove.

S6, coating a second dielectric layer on the first dielectric layer and the third metal layer, and two first through-holes are corresponding to the upward open groove and arranged on the second dielectric layer by etching, the two first through-holes pass through both of the first dielectric layer and the second dielectric layer and are spaced away from the third metal layer. And two second through-holes are arranged on the third metal layer and through the second dielectric layer by etching. Specifically, two the first through-holes through upper and bottom surfaces of the first dielectric layer and upper and bottom surfaces of the second dielectric layer, and two the second through-holes through upper and bottom surfaces of the second dielectric layer.

S7, covering a bottom ITO (indium tin oxide) layer on the second dielectric layer, inner surface of the two first through-holes and bottom surface of the two first through-holes corresponded to the second metal layer, and inner surface of the two second through-holes and bottom surface of the two second through-holes corresponded to the third metal layer.

The outside contour of the upward open groove is quadrilateral shape.

The outside contour of the third metal layer is Z-shaped structure.

Both of two first through-holes have same depth, and both of two second through-holes have same depth Both of two second through-holes are located on the upward open groove.

The first dielectric layer is directly formed by film formation, the second dielectric layer is formed by chemical vapor deposition (CVD), exposure, etching and photoresist stripping processes.

The bottom ITO (indium tin oxide) layer is formed by physical vapor deposition (PVD), exposure, etching and photoresist stripping processes.

As the mentioned above, comparing to traditional touch panel, a touch panel has a flat organic layer and a third metal layer bending along outside contour of upward open groove on flat organic layer for ensure the third metal layer cannot bridge over four holes. It could keep original back value of the third metal layer (don't need to change length of the third metal layer) for ensure transport signals between the third metal layer and the second metal layer, and also could satisfy requirement of original process windows, decrease rework rate and enhance productivity.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A touch panel switch, comprising
    a glass substrate;
    a buffer layer on the glass substrate;
    a gate insulating layer on the buffer layer;
    a second metal layer on the gate insulating layer; and further comprises:
    a flat organic layer coated on the second metal layer, and an upward open groove located on the flat organic layer by etching;
    a first dielectric layer coated on the flat organic layer, and an inner surface and a bottom surface of the upward open groove;
    a third metal layer on the first dielectric layer, wherein a side of the third metal layer is located outside the upward open groove and another side of the third metal layer is along the first dielectric layer and extends downwardly to the upward open groove;
    a second dielectric layer on the first dielectric layer and the third metal layer, and two first through-holes are arranged on the second dielectric layer by etching, the two first through-holes are through the first dielectric layer and the second dielectric layer and spaced away from the third metal layer;
    two second through-holes located outside the upward open groove, and on the third metal layer and through the second dielectric layer by etching; and
    a bottom ITO (indium tin oxide) layer on the second dielectric layer, inner surface and bottom surface of the two first through-holes, and inner surface and bottom surface of the two second through-holes.

2. The touch panel switch according to claim 1, wherein outside contour of the upward open groove is quadrilateral shape.

3. The touch panel switch according to claim 2, wherein outside contour of the third metal layer is Z-shaped structure.

4. The touch panel switch according to claim 3, wherein the two second through-holes are positioned on the upward open groove.

5. A touch panel, comprising a touch panel switch, the touch panel switch comprising a glass substrate;
a buffer layer on the glass substrate;
a gate insulating layer on the buffer layer;
a second metal layer on the gate insulating layer; and further comprises:
a flat organic layer coated on the second metal layer, and an upward open groove located on the flat organic layer by etching;
a first dielectric layer coated on the flat organic layer, and an inner surface and a bottom surface of the upward open groove;
a third metal layer on the first dielectric layer, wherein a side of the third metal layer is located outside the upward open groove and another side of the third metal layer is along the first dielectric layer and extends downwardly to the upward open groove;
a second dielectric layer on the first dielectric layer and the third metal layer, and two first through-holes are arranged on the second dielectric layer by etching, the two first through-holes are through the first dielectric layer and the second dielectric layer and spaced away from the third metal layer;
two second through-holes located outside the upward open groove, and on the third metal layer and through the second dielectric layer by etching; and
a bottom ITO (indium tin oxide) layer on the second dielectric layer, inner surface and bottom surface of the two first through-holes, and inner surface and bottom surface of the two second through-holes.

6. The touch panel switch according to claim 5, wherein outside contour of the upward open groove is quadrilateral shape.

7. The touch panel switch according to claim 6, wherein outside contour of the third metal layer is Z-shaped structure.

8. The touch panel switch according to claim 7, wherein the two second through-holes are positioned on the upward open groove.

9. A manufacturing method of a touch panel switch, comprising steps of: arranging a glass substrate; arranging a buffer layer, a gate insulating layer and a second metal layer in sequentially on the glass substrate; coating a flat organic layer on the second metal layer, etching an upward open groove on the flat organic layer; coating a first dielectric layer on the flat organic layer, and an inner surface of the upward open groove and bottom surface of the upward open groove corresponding to the second metal layer; arranging a third metal layer on the first dielectric layer, a side of the third metal layer is located outside the upward open groove and another side of the third metal layer is along the first dielectric layer and extends downwardly to the upward open groove; coating a second dielectric layer on the first dielectric layer and the third metal layer, and etching two first through-holes located outside the upward open groove, and arranged on the second dielectric layer, the two first through-holes through the first dielectric layer and the second dielectric layer and spaced away from the third metal layer, and two second through-holes are arranged on the third metal layer and through the second dielectric layer by etching; and covering a bottom ITO (indium tin oxide) layer on the second dielectric layer, inner surface of the two first through-holes and bottom surface of the two first through-holes, and inner surface of the two second through-holes and bottom surface of the two second through-holes.

10. The manufacturing method of the touch panel switch according to claim 9, wherein outside contour of the upward open groove is quadrilateral shape.

11. The manufacturing method of the touch panel switch according to claim 10, wherein outside contour of the third metal layer is Z-shaped structure.

12. The manufacturing method of the touch panel switch according to claim 11, wherein both of two first through-holes have same depth, and both of two second through-holes have same depth.

13. The manufacturing method of the touch panel switch according to claim 12, wherein the two second through-holes are positioned on the upward open groove.

* * * * *